(12) United States Patent
Truskalo et al.

(10) Patent No.: US 6,437,523 B1
(45) Date of Patent: *Aug. 20, 2002

(54) DEFLECTION CIRCUITS COUPLED VIA A FILTER

(75) Inventors: Walter Truskalo; John Felix Shouse, Jr., both of Indianapolis, IN (US)

(73) Assignee: Thomson Licensing S.A., Boulogne (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/465,617

(22) Filed: Dec. 17, 1999

Related U.S. Application Data

(60) Provisional application No. 60/115,709, filed on Jan. 12, 1999.

(51) Int. Cl.$^7$ .................................................. G09G 1/04
(52) U.S. Cl. ...................... 315/371; 315/369; 315/395
(58) Field of Search ................................. 315/369, 370, 315/371, 393, 395, 403, 398, 405

(56) References Cited

U.S. PATENT DOCUMENTS

| | | | |
|---|---|---|---|
| 3,433,998 A | 3/1969 | Wolber | 315/27 |
| 3,881,134 A | 4/1975 | Haferl | 315/398 |
| 3,949,269 A | 4/1976 | Wheeler | 315/371 |
| 4,063,134 A | 12/1977 | Iida | 315/371 |
| 4,198,591 A | 4/1980 | Ohmori | 315/371 |
| 4,482,846 A | 11/1984 | Worster | 315/371 |
| 4,642,530 A | 2/1987 | Rodriguez-Cavazos | 315/371 |
| 4,988,927 A | 1/1991 | Spruck | 315/371 |
| 5,077,501 A | 12/1991 | Hartmann et al. | 315/371 |
| 5,111,120 A | 5/1992 | Haferl | 315/393 |
| 5,402,044 A | 3/1995 | Haferl | 315/371 |
| 5,442,262 A | 8/1995 | Van Tiel | 315/371 |
| 5,444,338 A | 8/1995 | George et al. | 315/371 |
| 5,448,140 A | 9/1995 | Douken et al. | 315/371 |
| 5,583,400 A | 12/1996 | Hulshof et al. | 315/371 |
| 5,798,621 A | 8/1998 | Truskalo et al. | 315/371 |

OTHER PUBLICATIONS

US 5,909,092, 06/1999, Truskalo et al. (withdrawn)

*Primary Examiner*—Don Wong
*Assistant Examiner*—Shih-Chao Chen
(74) *Attorney, Agent, or Firm*—Joseph S. Tripoli; Harvey D. Fried; Sammy S. Henig

(57) ABSTRACT

A secondary winding of a horizontal flyback transformer of a horizontal deflection circuit develops a horizontal retrace pulse voltage. A secondary winding of a second transformer is coupled in series with a vertical deflection coil of a vertical deflection circuit. An R-C filter is coupled between the secondary winding of the flyback transformer and a primary winding of the second transformer. Horizontal parallelogram errors are corrected by a horizontal rate current injected in a current path of the vertical deflection coils. The R-C filter prevents the vertical deflection current from being parasiticaly coupled to the horizontal deflection circuit.

6 Claims, 2 Drawing Sheets

Figure 1:
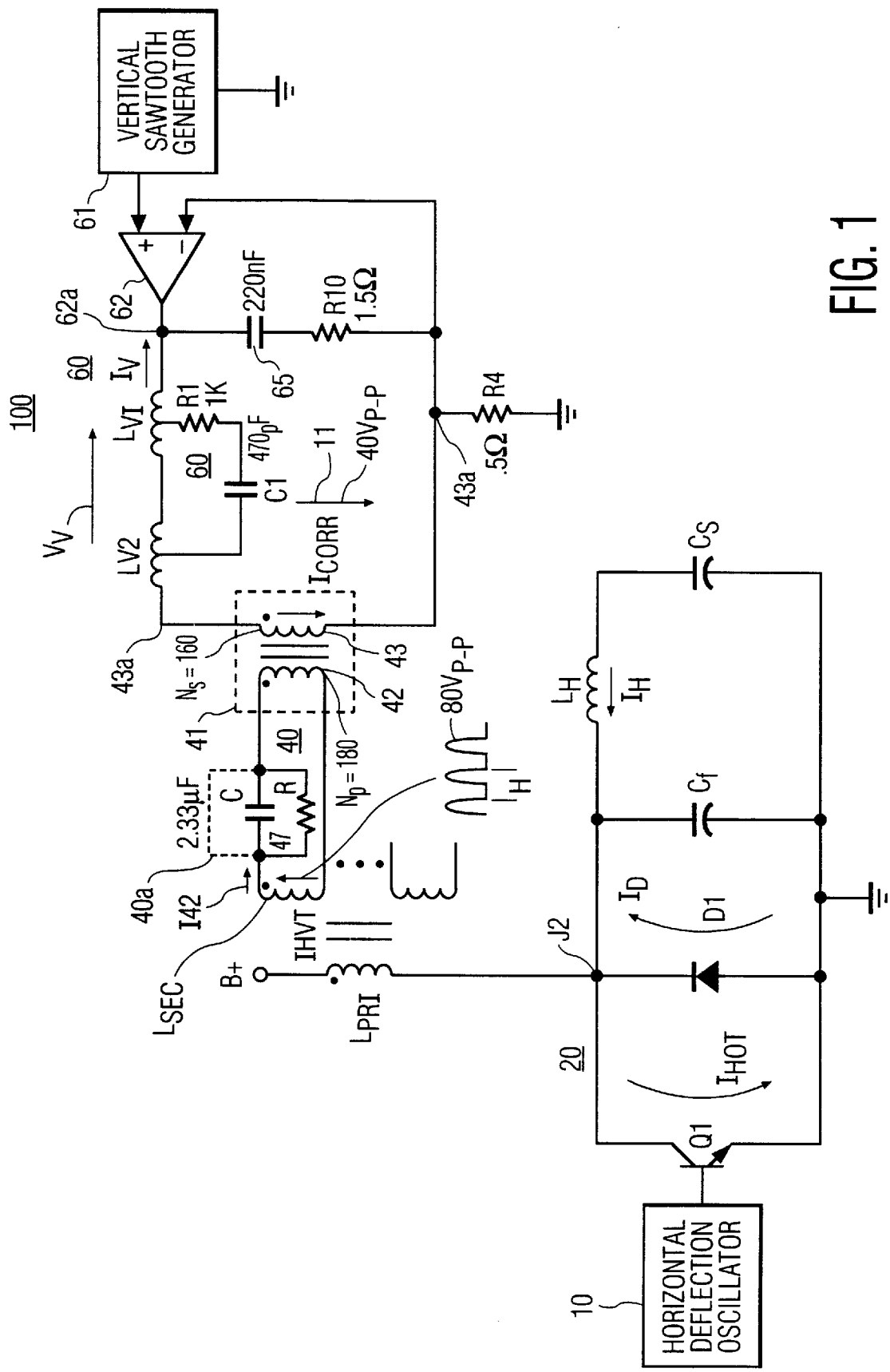

DEFLECTION CIRCUITS COUPLED VIA A FILTER

This Application claims Benefit of provisional Application Ser. No. 60/115,709 filed Jan. 12, 1999.

FIELD OF THE INVENTION

The invention relates to raster correction circuits of a video display.

BACKGROUND

In a cathode ray tube (CRT) of a video display, a raster is formed by deflecting an electron beam across a phosphor screen. Each electron beam is deflected in a horizontal direction by a magnetic field produced by in a horizontal deflection coil by a horizontal-rate sawtooth current. Likewise, the electron beam is simultaneously deflected in a vertical direction by a magnetic field produced by a vertical deflection coil by a vertical-rate sawtooth current. The result is a negatively-sloped, or "downhill", scan line as the electron beam is deflected from left to right to form the CRT's raster. In a typical cathode ray tube used in a color television receiver and having, for example, a screen width of approximately 723 mm and a screen height of approximately 538 mm, a horizontal scan line may drop a distance of approximately 2.4 mm from a perfectly horizontal position in one field. This downhill scan effect introduces both orthogonality and parallelogram errors into the raster.

In a perfectly rectangular raster, horizontal and vertical center lines are orthogonal, or perpendicular, to one another. Downhill scanning does not produce a perfectly rectangular raster and hence results in a non-orthogonal relationship between the horizontal and vertical center lines of the raster. Orthogonality error is a quantitative measure, expressed in units of radians or degrees, of the extent to which the horizontal and vertical center lines of a raster depart from orthogonality. The orthogonality error may be magnified at the left and right edges of the raster because the deflection sensitivity increases near the edges of the raster. As a result, the edges of the raster may tilt such that the raster has a generally parallelogram shape. errors in a raster can be obtained by providing a horizontal-rate modulation of a vertical deflection current for substantially offsetting the downhill scan effect caused by vertical deflection of the electron beam. In one of the circuits shown Elimination of both orthogonality and parallelogram errors in a raster can be obtained by providing a horizontal-rate modulation of a vertical deflection current for substantially offsetting the downhill scan effect caused by vertical deflection of the electron beam. A winding of a horizontal flyback transformer can be used to apply a horizontal retrace pulse voltage to a primary winding of a transformer. A secondary winding of the transformer can be coupled to a vertical deflection winding for providing a small horizontal rate sawtooth current to be superimposed on a vertical deflection current.

Coupling back of the vertical current to the horizontal deflection circuit is reduced by the relatively large leakage of the transformer. Nevertheless, the residual vertical rate current, during vertical retrace, can still produce a disturbance at the top of the screen, immediately after vertical retrace. It may be desirable to further reduce the coupling back of the vertical current to the horizontal deflection circuit.

In carrying out an inventive feature, an R-C filter is interposed in a current path between the transformers. The R-C filter attenuates the coupled back vertical deflection current. Thereby, the addition of the R-C coupling filter prevents the vertical deflection current from affecting the horizontal deflection circuit.

SUMMARY OF THE INVENTION

A video display deflection apparatus, embodying an inventive feature, includes a first deflection circuit for generating a first deflection current at a first deflection frequency in a first deflection winding to vary a position of an electron beam in a first direction. A second deflection circuit is used for generating a second deflection current in a second deflection winding at a second deflection frequency to vary the position of the electron beam in a second direction. A filter couples the second deflection circuit to the first deflection winding to generate a corrective current in a current path formed by the first deflection winding at a frequency related to the second deflection frequency for providing raster error correction. The filter significantly attenuates parasitic signal coupling in an opposite direction, from the first deflection circuit to the second deflection circuit.

BRIEF DESCRIPTION OF THE DRAWINGS

FIG. 1 illustrates an arrangement for correcting orthogonality and parallelogram errors in a raster, including a filter, in accordance with an inventive feature;

FIGS. 2*a* and 2*b* illustrate waveforms useful for explaining the operation of the deflection system shown in FIG. 1, when the filter is employed; and FIGS. 3*a* and 3*b* illustrate waveforms useful for explaining the operation of the deflection system shown in FIG. 1, when the filter is removed.

DETAILED DESCRIPTION

A deflection system 100 of FIG. 1 provides deflection for a cathode ray tube, not shown, of a television receiver or a video display terminal. A $B^+$ voltage is coupled to a conventional horizontal deflection circuit 20 through a primary winding $L_{PRI}$ of a flyback transformer IHVT. A damper current $I_D$ flows through a damper diode D1 to deflect an electron beam from a left edge of a raster to a center of the raster. A horizontal output transistor Q1 conducts a current $I_{HOT}$ to deflect the electron beam from the center of the raster to a right edge of the raster. A horizontal deflection current $I_H$ flowing through a horizontal deflection winding $L_H$ may have a peak-to-peak amplitude of approximately 12 A. A trace capacitor $C_S$, coupled in series with deflection winding $L_H$ provides S-correction for the horizontal deflection current $I^H$.

A secondary winding $L_{SEC}$ of flyback transformer IHVT is coupled via an R-C filter 40, embodying an inventive feature, to a primary winding 42 of a raster correction transformer 41. Transformer 41 has a secondary winding 43. Transformer 41 is wound on a ferrite slug core 1" long× 0.399" diameter. Winding 43 has $N_S$=60 turns, 5-strand Litz AWG#30 wire, and winding 42 has $N_P$=180 turns, AWG#29 wire.

A horizontal-rate retrace pulse, not shown, produced in a conventional manner in deflection circuit 20, is transformer-coupled to secondary winding $L_{SEC}$ of transformer IHVT to develop a horizontal-rate retrace pulse 12. Retrace pulse 12 is coupled via R-C filter 40, embodying an inventive feature, to winding 42 of transformer 41. Transformer 41 steps down a significant portion of horizontal-rate pulse 12 coupled through R-C filter 40 and developed in winding 42 according to transformer 41 turns ratio. Raster correction transformer 41 develops a stepped-down horizontal-rate pulse waveform 11 with a peak-to-peak voltage of approximately 50 Vpp across secondary winding 43. Similarly, a horizontal raster correction current $I_{CORR}$ is induced in secondary winding 43.

A direct current (DC) coupled vertical deflection circuit 60 includes a conventional vertical-rate sawtooth generator 61 that provides a vertical-rate sawtooth waveform to a non-inverting input of a conventional vertical output amplifier 62. Vertical output amplifier 62 may include a push-pull transistor output stage, not shown. Vertical output amplifier 62 drives a vertical deflection windings $L_{V1}$ and a vertical deflection windings $L_{V2}$, coupled in series, with a vertical-rate sawtooth current $I_V$. Current $I_V$ may have a peak-to-peak amplitude of approximately A. (2.6 App)

Vertical deflection windings $L_{V1}$ and $L_{V2}$ are also coupled in series with winding 43 of transformer 41 and with resistor R4. Current-sense resistor R4 generates a feedback voltage at an inverting input of vertical output amplifier 62 responsive to the vertical deflection current $I_V$. Except for the modulation provided by raster correction current $I_{CORR}$ induced in secondary winding 43, vertical deflection circuit 60 generates current $I_V$ in a conventional manner. Horizontal rate raster correction current $I_{CORR}$ flows through both vertical deflection windings $L_{V1}$ and $L_{V2}$ to produce a magnetic field which opposes the aforementioned downhill scan effect.

For explanation purposes, assume that filter 40 is not used. Instead, assume that winding $L_{SEC}$ of high-voltage transformer IHVT is coupled directly in parallel with winding 42 of transformer 41, as shown by a jumper conductor 40a.

Figure 3A:
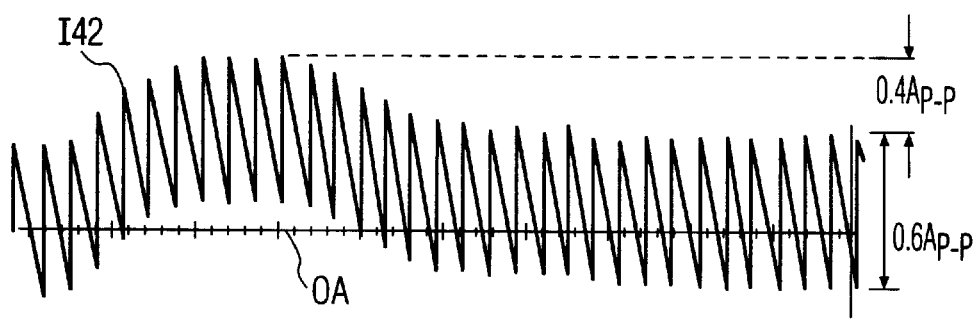
Figure 3B:
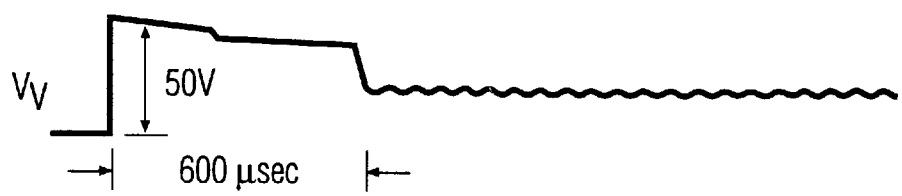

Vertical deflection current $I_V$ flows through secondary winding 43 of transformer 41. During vertical retrace, a vertical pulse voltage $V_V$ of FIG. 3b, developed across windings $L_{V1}$ and $L_{V2}$ of FIG. 1, produces a vertical rate current component in a current 142 of winding 42 of transformer 41. Vertical rate modulation of current 142 of FIG. 3a, during the retrace portion of vertical pulse voltage $V_V$ of FIG. 3b, shifts the average value of current 142 in a vertical rate. Similar symbols and numerals in FIGS. 1, 3a and 3b indicate similar items or functions.

The vertical rate current component in current 142 of FIG. 1 may be coupled back to horizontal deflection circuit 20 via transformer IHVT and, disadvantageously, may initiate ringing in horizontal deflection winding $L_H$. A resulting width disturbance can become visible on the display screen, not shown.

In carrying out an inventive feature, the coupling back from the vertical to the horizontal is reduced or eliminated by the addition of R-C filter 40 between winding $L_{SEC}$ of transformer IHVT and winding 42 of transformer 41. This situation is demonstrated, when jumper conductor 40a in FIG. 1 is removed and filter 40 is interposed. Capacitor C of filter 40 forms a low impedance for horizontal rate current component of current 142. Therefore, Capacitor C of filter 40 does not attenuate the horizontal rate current component of current 142. On the other hand, for the vertical rate current component of current 142, capacitor C forms a high impedance and acts as an attenuator. Thereby, coupling back, is advantageously, attenuated significantly.

Figure 2A:
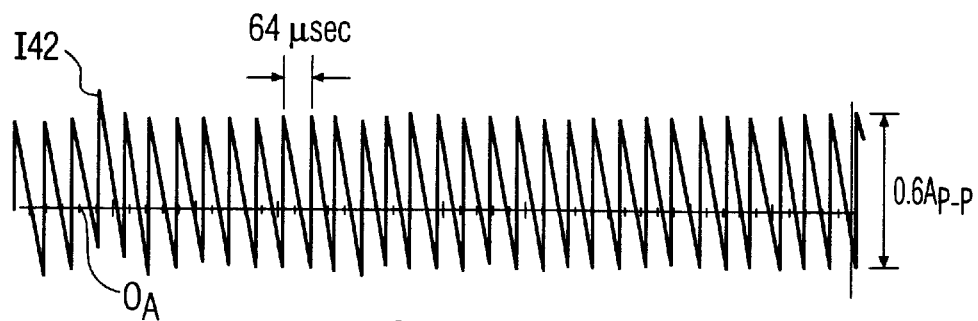
Figure 2B:
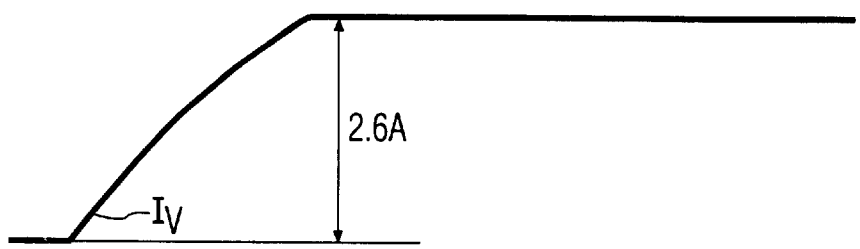

The waveform of primary current 142 when R-C filter 40 is in circuit is shown in FIG. 2a. In contrast to the waveform in FIG. 3a, vertical deflection current $I_V$ of FIG. 2b, during vertical retrace, advantageously, does not produce any significant vertical rate current component in current 142 of FIG. 2a. Similar symbols and numerals in FIGS. 1, 3a, 3b, 2a and 2b indicate similar items or functions. The elimination of the parasitic, back coupling effect in current 142 of FIG. 2a from current $I_V$ of FIG. 2b, advantageously, eliminates the width artifact at the start of vertical scan.

A damping circuit 60 is formed by a resistor R1 and a capacitor C1, coupled in series. Circuit 60, is coupled between a center tap 21, approximately in the midpoint of vertical deflection windings $L_{V1}$, and a center tap 21, approximately, in the midpoint of vertical deflection windings $L_{V2}$.

The effectiveness of the injection of parallelogram/orthogonality error correction current ICORR by winding 43 at an end terminal 43a of the vertical deflection windings $Lv_{V1}$ and $L_{V2}$, that is remote from amplifier 62, is facilitated by installing damping circuit 60 formed by resistor R1 and capacitor C1. Damping circuit 60 increases the sensitivity of windings $L_{V1}$ and $L_{V2}$ to correction current $I_{CORR}$. Consequently, single ended drive is sufficient.

What is claimed is:

1. A video display deflection apparatus, comprising:
   a vertical deflection circuit for generating a vertical deflection current at a vertical deflection frequency in a vertical deflection winding to vary a position of an electron beam in a vertical direction;
   a horizontal deflection circuit for generating a horizontal deflection current in a horizontal deflection winding at a horizontal deflection frequency to vary the position of said electron beam in a horizontal direction; and
   a filter for coupling said horizontal deflection circuit to said vertical deflection winding to generate a corrective current in a current path formed by said vertical deflection winding at a frequency related to said horizontal deflection frequency for providing raster error correction, said filter significantly attenuating parasitic signal coupling in an opposite direction, from said vertical deflection circuit to said horizontal deflection circuit.

2. The deflection apparatus according to claim 1, wherein said corrective current substantially reduces a downward slope imparted to said electron beam as said electron beam is deflected between first and second lateral edges of said raster.

3. The deflection apparatus according to claim 1, wherein said corrective current corrects at least one of parallelogram and orthogonality errors.

4. The deflection circuit of claim 1, wherein said corrective current has a horizontal scanning rate.

5. The deflection circuit of claim 1, wherein said vertical deflection circuit provides vertical deflection and includes a winding of a first transformer and said horizontal deflection circuit includes a winding of a horizontal flyback transformer and wherein said filter is coupled in a current path between said transformers.

6. The deflection apparatus according to claim 1 wherein said filter comprises a capacitor having a low impedance at said horizontal deflection frequency for coupling a horizontal rate signal from said horizontal to said vertical deflection circuit without significant attenuation and a high impedance at said vertical deflection frequency for attenuating a vertical rate signal of said vertical deflection circuit.

* * * * *